(12) United States Patent
Eva

(10) Patent No.: US 11,874,525 B2
(45) Date of Patent: Jan. 16, 2024

(54) OPTICAL ELEMENT AND LITHOGRAPHY SYSTEM

(71) Applicant: Carl Zeiss SMT GmbH, Oberkochen (DE)

(72) Inventor: Eric Eva, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/805,175

(22) Filed: Jun. 2, 2022

(65) Prior Publication Data
US 2022/0299731 A1 Sep. 22, 2022

Related U.S. Application Data

(63) Continuation of application No. PCT/EP2020/074399, filed on Sep. 2, 2020.

(30) Foreign Application Priority Data

Dec. 9, 2019 (DE) .......................... 102019219179.7

(51) Int. Cl.
*G03F 7/00* (2006.01)
*G02B 7/18* (2021.01)
(Continued)

(52) U.S. Cl.
CPC ........ *G02B 7/1815* (2013.01); *B23K 26/0624* (2015.10); *B23K 26/55* (2015.10);
(Continued)

(58) Field of Classification Search
CPC ............ B23K 2103/54; B23K 26/0624; B23K 26/082; B23K 26/362; B23K 26/55;
(Continued)

(56) References Cited

U.S. PATENT DOCUMENTS 9,618,859 B2 * 4/2017 Koevoets ............ G03F 7/70891
10,955,595 B2 * 3/2021 Van Berkel .......... G02B 7/1815
(Continued)

FOREIGN PATENT DOCUMENTS

DE 10 2009 039 400 A1 3/2011
DE 10 2017 221 388 A1 10/2018
(Continued)

OTHER PUBLICATIONS

Translation of International Search Report for corresponding Appl No. PCT/EP2020/074399, dated Nov. 13, 2020.
(Continued)

*Primary Examiner* — Deoram Persaud
(74) *Attorney, Agent, or Firm* — Fish & Richardson P.C.

(57) ABSTRACT

An optical element reflects radiation, such as EUV radiation. The optical element includes a substrate with a surface to which a reflective coating is applied. The substrate has at least one channel through which a coolant can flow. The substrate is formed from fused silica, such as titanium-doped fused silica, or a glass ceramic. The channel has a length of at least 10 cm below the surface to which the reflective coating is applied. The cross-sectional area of the channel varies by no more than +/−20% over the length of the channel.

21 Claims, 2 Drawing Sheets

(51) Int. Cl.
*B23K 26/0622* (2014.01)
*B23K 26/55* (2014.01)
*C03C 14/00* (2006.01)
*G02B 5/08* (2006.01)
*G02B 17/06* (2006.01)
*B23K 103/00* (2006.01)

(52) U.S. Cl.
CPC ............ *C03C 14/004* (2013.01); *G02B 5/085* (2013.01); *G02B 5/0891* (2013.01); *G02B 17/0663* (2013.01); *G03F 7/70316* (2013.01); *G03F 7/70891* (2013.01); *G03F 7/70958* (2013.01); *B23K 2103/54* (2018.08); *C03C 2214/04* (2013.01); *C03C 2214/20* (2013.01)

(58) Field of Classification Search
CPC ....... C03C 14/004; C03C 15/00; C03C 17/22; C03C 2201/42; C03C 2214/04; C03C 2214/20; C03C 3/06; G02B 17/0663; G02B 5/085; G02B 5/0891; G02B 5/10; G02B 7/1815; G03F 7/70316; G03F 7/70825; G03F 7/70891; G03F 7/7095; G03F 7/70958
See application file for complete search history.

(56) References Cited

U.S. PATENT DOCUMENTS

| | | | | |
|---|---|---|---|---|
| 2006/0227826 | A1* | 10/2006 | Balogh | G21K 1/062 372/34 |
| 2008/0099935 | A1* | 5/2008 | Egle | C03B 23/0252 264/1.7 |
| 2009/0122428 | A1* | 5/2009 | Phillips | G02B 7/181 359/846 |
| 2009/0253957 | A1* | 10/2009 | Yasunaga | A61B 1/05 600/109 |
| 2010/0220302 | A1* | 9/2010 | Gischa | G03F 7/70891 355/30 |
| 2011/0051267 | A1 | 3/2011 | Kierey et al. | |
| 2013/0335816 | A1* | 12/2013 | Kierey | G02B 5/1857 359/359 |
| 2014/0071523 | A1* | 3/2014 | Hartjes | G03F 7/70891 359/359 |
| 2018/0149985 | A1* | 5/2018 | Liu | G03F 7/70875 |
| 2022/0298079 | A1* | 9/2022 | Mitra | C03C 3/11 |

FOREIGN PATENT DOCUMENTS

| | | |
|---|---|---|
| DE | 10 2018 218 998 A1 | 12/2018 |
| DE | 10 2019 217 530 A1 | 12/2019 |

OTHER PUBLICATIONS www.ilt.fraunhofer.de/de/mediathek/prospekte/themenbroschuereselektiveslaseraetzen.html.
SLE with LightFab 3D Printer, Fa. Lightfab GmbH (www.lightfab.de), see www.lightfab.de/files/Downloads/SLE_3D_printed_glass.pdf.
Translation of International Report on Patentability for corresponding Appl No. PCT/EP2020/074399, dated Jun. 23, 2022.
German Office Action with translation thereof, for corresponding Appl No. 102019219179.7, dated Jun. 24, 2020.

\* cited by examiner $$A_M = \frac{1}{2}(A_{MAX} + A_{MIN})$$

OPTICAL ELEMENT AND LITHOGRAPHY SYSTEM

CROSS-REFERENCE TO RELATED APPLICATION

The present application is a continuation of, and claims benefit under 35 USC 120 to, international application PCT/EP2020/074399, filed Sep. 2, 2020, which claims benefit under 35 USC 119 of German Application No. 102019219179.7 of Dec. 9, 2019. The entire disclosure of each of these applications are incorporated by reference herein.

FIELD

The disclosure relates to an optical element for reflecting radiation, such as for reflecting EUV radiation, as well as a lithography system, such as an EUV lithography system, which has at least one such optical element.

BACKGROUND

Reflective optical elements in the form of mirrors, such as in the form of mirrors of a projection system, are typically exposed to a high radiant flux in an EUV lithography system in the form of an EUV lithography apparatus. As the EUV radiation source has more power, the mean powers radiated onto the mirrors are as much as 50 W, a third to a half of which can be absorbed in the layer system of the reflective coating and can lead to areal and local heating of the mirror or of the substrate. Even if a so-called zero expansion material (e.g., in the form of titanium-doped fused silica, such as ULE®, Asahi Zero, or in the form of a glass ceramic, such as Zerodur® or Clearceram®) is used, this heating can lead to shape changes of the surface of the mirror to which the reflective coating is applied. These shape changes can be traced back, inter alia, to inhomogeneities in the (linear) coefficient of thermal expansion (CTE) or zero-crossing temperature ($T_{ZC}$) within the volume of the substrate, and can be traced back to the fact that the coefficient of thermal expansion differs significantly from zero away from the zero-crossing temperature.A For reducing the temperature of the mirrors in EUV lithography systems, it is known practice to introduce, into the substrate, channels through which a cooling fluid flows. In EUV lithography systems, such channels can be used, inter alia, for mirrors with a substrate made of SiSiC (EUV collectors) or aluminum (grazing incidence mirrors), and for support structures. The channels are usually milled into the substrate during the production, and a cover can be welded or sintered on top.

On account of the suspended mount of the mirrors and the generally disadvantageous effect on image aberrations, turbulent flows and vibrations that can be traced back to the flow of the (generally liquid) coolant ("flow-induced vibrations", FIV) are typically undesirable. However, the inner sides of the milled channels are generally angular and rough, which can be undesirable regarding FIV.

DE 10 2017 221 388 A1 describes an optical element for reflecting radiation, the element having a substrate with at least one pipe section through which a cooling fluid is capable of flowing. The substrate is produced by mechanical compacting and sintering, such as by way of hot isostatic pressing. In one example, both the substrate and the pipe section through which the cooling fluid is capable of flowing are made of glass, for example titanium-doped fused silica.

Using selective laser-induced etching (SLE), it is possible to produce micro-channels, profiled bores, etc. in transparent component parts, for example made of fused silica, borosilicate glass, sapphire or ruby, cf., for example, "www.ilt.fraunhofer.de/de/mediathek/prospekte/themenbroschuere-selektiveslaseraetzen.html". In selective laser-induced etching, light in the form of ultrashort pulsed laser radiation (ps- or fs-pulses) is typically focused in the volume of a transparent workpiece. In this case, the pulse energy is usually only absorbed within the focal volume as a result of multi-photon processes. In the focal volume, the optical and chemical properties of the transparent material can be changed, without cracks or possibly with microcracks, in such a way that it can be rendered selectively chemically etchable. Depending on the laser parameters used, the modification of the material can be microcracks or other damage at depth. By deflecting the focus in the material, for example using a microscanner system, contiguous regions can be modified and these can subsequently be removed using wet chemical etching. In the case of wet chemical etching, the component is typically immersed in an etching solution over several weeks or months, the etching solution can (selectively) remove the modified material. Any desired hollow structures, for example channels, can be produced by the scanning or the movement of the laser radiation in the volume of the workpiece.

A limitation of the selective laser-induced etching of channels in fused silica and also in titanium-doped fused silica can be the comparatively low etch selectivity of approximately 1:500 to approximately 1:1500 in comparison with other transparent materials, for example sapphire, which has an etch selectivity of 1:10,000, cf., the publication "SLE with LightFab 3D Printer" by Lightfab GmbH ("www.lightfab.de"), retrievable from "www.lightfab.de/files/Downloads/SLE_3D_printed_glass.pdf". During etching, the low etch selectivity can lead to the channel having a wider form in a region at the edge of the component, which can be attacked first by the etching liquid, than further inside the volume of the component. The regions that are too wide may lead to inhomogeneous cooling of the component and may possibly carry through mechanically. In extreme cases, too strong etching may lead to short circuits between adjacent channels.

Channels in the substrate can also be used for cooling purposes in other optical systems, for example in lithography apparatuses for the DUV wavelength range, which predominantly contain lens elements in place of mirrors. However, the focus of the application in that case is generally not in the use of the channels for cooling purposes, but in the integration of decouplings or actuators in a respective channel.

In the context of the present application, the EUV wavelength range is understood to be a wavelength range between approximately 5 nm and approximately 30 nm, and, in the context of the present application, the DUV wavelength range is understood to be a wavelength range between approximately 30 nm and approximately 370 nm.

SUMMARY

The disclosure seeks to provide an optical element and a lithography system in which there can be efficient cooling even in the case of a high thermal load.

The disclosure provides an optical element for reflecting EUV radiation, in which the channel has a length of at least 10 cm, such as at least 20 cm, below the surface to which the reflective coating is applied, and in which a cross-sectional area of the channel varies by no more than +/−20%, such as by no more than +/−10%, for example by no more than +/−2%, over the length of the channel below the surface to which the reflective coating is applied.

In the context of this application, a channel through which a coolant is capable of flowing is understood to mean, in the simplest case, a channel which has two ends open to the surroundings, that is to say a channel that forms a through-channel in the substrate. In the case where a plurality of channels that are connected to one another at junctions are provided within the substrate, the (nominal) mean channel cross section typically changes at each division into two or more channels or at each merger of two or more channels at a respective junction. In this case, a channel is understood to mean a channel section between two adjacent junctions, that is to say a channel whose (nominal) channel cross section is constant.

Below, an assumption is made that a coolant is capable of flowing through the channel, which is why the channel is also referred to as cooling channel. However, it is understood that the channel need not necessarily be used for cooling purposes, but for example may be used for the integration of components into the substrate or for other applications.

In the optical element according to the disclosure, at least one channel with a significant length is used for cooling the optical element. Such a channel can be desirable for the efficient cooling of mirrors in projection systems of EUV lithography apparatuses, the mirrors having comparatively large optically used mirror surfaces with dimensions of, e.g., 10 cm×10 cm to 100 cm×100 cm. As described above, there may be inhomogeneous cooling of the component and possibly mechanical damage to the component in the wider cross-sectional regions of a channel with a significantly varying cross section.

In the context of this application, a variation of the cross-sectional area of the channel of +/−x % is understood to mean a deviation by +/−x % from a mean cross-sectional area $A_M$ of the channel. The mean cross-sectional area $A_M$ is defined as the mean value of the maximum cross-sectional area $A_{MAX}$ and the minimum cross-sectional area $A_{MIN}$ along the length of the channel ($A_M=(A_{MAX}+A_{MIN})/2$).

The surface to which the reflective coating is applied is understood to mean that surface or that surface region of the substrate to which the reflective coating is applied. The surface or the end side of the substrate may optionally extend laterally beyond this surface region. In this case, the length of the channel is understood to mean the length over which the channel extends within a (partial) volume region of the substrate which, in the thickness direction of the substrate, is arranged below the surface to which the reflective coating is applied. Sections of the channel protruding laterally beyond this (partial) volume region need not satisfy the condition in relation to the constancy of the cross-sectional area specified above, even if this is desirable in general. The channel can satisfy the condition in relation to the constancy of the cross-sectional area, specified above, over its entire length, that is to say even in a possibly present partial volume region of the substrate outside of the partial volume region of the substrate covered by the reflective coating.

The substrate can be monolithic. A monolithic substrate is understood to mean that the substrate is in one piece and has no joining face. In contrast thereto, substrates with milled cooling channels have at least one joining face level with the cooling channels. In the case where all cooling channels are arranged substantially along a common curved or plane face, such a joining face typically extends parallel to the face with the cooling channels. Such a joining face on the optical element or on the substrate is identifiable, for example, on the basis of many small bubbles or on the basis of a refractive index jump, which occurs between the two joined segments or partial bodies of the substrate.

It is also possible for the substrate to have a joining face, either in the region of the cooling channels or optionally elsewhere. In this case, two or more substrate parts are interconnected at the joining face by a bonding method, with the use of a joining agent generally being dispensed with. By way of example, the bonding method can be high-temperature bonding, direct bonding, silicate bonding, etc. Should the joining face extend through the region of the cooling channel or intersect the cooling channel, the two substrate parts can be interconnected, such as at the joining face, before the cooling channel is formed in the substrate.

The production of a monolithic substrate or optionally multi-part substrate having at least one cooling channel which has the properties described further above is typically implemented by way of the above-described selective laser-induced etching. Chemical bonds between silicon and oxygen in the case of a substrate made of fused silica ($SiO_2$) or chemical bonds between titanium and oxygen in the case of a substrate made of titanium-doped fused silica can be broken during the selective laser-induced etching as a result of the multi-photon excitation.

For fused silica, it is known that such bonds can recombine or are saturated by hydrogen present in the glass. Therefore, an assumption can be made that the bonds between titanium and oxygen are likewise saturated should hydrogen be present. Titanium-doped fused silica typically contains comparatively high concentrations of hydrogen of more than $10^{17}$ molecules/cm$^3$ if produced in a direct deposition process (e.g., ULE®). Even in the case where the titanium-doped fused silica is produced in a soot process, the hydrogen concentration is typically more than $10^{15}$ molecules/cm$^3$.

In general, the etch selectivity in conventional selective laser-induced etching is not sufficient to maintain the above-described requirements in respect of the substantially constant cross section of the cooling channel over a significant length of more than 10 cm or 20 cm in the case of a substrate made of fused silica or made of titanium-doped fused silica.

It is known that the saturation of the bonds is metastable and is broken again in the fused silica, for example as a result of absorbing UV radiation. Therefore, to increase the etch selectivity, during the etching process, the etching front, that is to say the region in which the etching solution currently attacks the material of the substrate, can be irradiated with the laser radiation used for modifying the substrate material at wavelengths of, e.g., approximately 1 µm—not necessarily with ultrashort pulse laser radiation—or with radiation at other wavelengths, for example with UV radiation. For example, it is possible to implement the actual damage or modification to the substrate material during the selective laser-induced etching in the etch bath. Although this increases the processing time in the exposure or scanner system, it may accelerate the etching rates to such an extent that it is nevertheless economical to equip a respective etching apparatus with an exposure or scanner system for selective laser-induced etching. The etch selectivity within the scope of selective laser-induced etching of (titanium-doped) fused silica may optionally also be increased in a different way to the irradiation of the etching front. The etch bath or the etching solution may be a (slightly) acidic, a substantially neutral or a basic etching solution. A substantially neutral etching solution can minimize the roughening.

In one embodiment, the channel has a mean cross-sectional area which is between 100 μm² and 25 mm², such as between 1 mm² and 25 mm². Channels for cooling optical elements which are introduced into the material of the substrate with the aid of conventional production methods, e.g., milling, typically have relatively large cross-sectional areas of, in general, approximately 1 cm×1 cm and a typically high roughness, which can be traced back to an etching process that follows the milling and is required, inter alia, to treat mechanical stresses generated during the milling.

However, the use of channels with smaller cross sections of the order specified above, that is to say of the order of a few 100 μm² or mm², was found to be more desirable for the cooling: To avoid FIV, the flow through the channels should remain as clearly as possible in the laminar range, that is to say the Reynolds number should be significantly below 1000. Since the Reynolds number reduces with decreasing diameter of the channel, the provision of channels with small cross sections was found to be advantageous in view of FIV. Even in the case of such small cross sections, overall volumetric flow rates of the cooling fluid—as a summation over all channels connected in parallel—of the order of, e.g., 1 l/min or more, which were found to be particularly advantageous for cooling the optical element, can be achieved.

In a further embodiment, the cross-sectional area of the channel has a ratio of height to width of less than 5:1. In general, it is desirable from a structural point of view for the channels to have a greater height than width since the risk of pressing into the channels when polishing the surface is reduced. In this case, the height of the channel is measured in the thickness direction of the substrate, that is to say perpendicular to the base of the substrate. The width is measured in a direction which is perpendicular to the thickness direction of the substrate and is aligned perpendicular to the longitudinal direction of the channel at the respective location within the substrate. It is understood that the channels may have a rectangular or square cross section, or else a round or oval cross section.

In a further embodiment, the surface to which the reflective coating is applied has a maximum extent between 10 cm and 100 cm in at least one direction perpendicular to a thickness direction of the substrate. Should the surface of the optical element be rotationally symmetric, the surface has a diameter ranging between 10 cm and 100 cm. Should the surface of the optical element not be rotationally symmetric, the maximum extent of the substrate denotes the maximum distance between two points along the edge of the substrate or the optical surface in the respective direction.

In a further embodiment, the at least one channel runs at a substantially constant distance from the surface to which the reflective coating is applied, the surface can be curved, with the distance optionally being between 1-times and 3-times, such as between 1.5-times and 2.2-times, a distance between adjacent channels.

In the context of this application, a substantially constant distance of the channel from the surface is understood to mean that the distance of the center of the cross-sectional area of the channel from the surface (measured in the thickness direction, i.e., Z-direction) varies by no more than +/−20%, such as by no more than +/−10%, for example by no more than +/−5%, along the length of the channel. Like in the case of the cross section of the channel, a variation of the distance of the channel of +/−x % is understood to mean a deviation by +/−x % from a mean distance of the channel from the surface. The mean distance is defined as the mean value of the maximum distance and the minimum distance from the surface along the length of the channel. For cooling, it was found to be advantageous if the (constant) distance is between 1-times and 3-times, such as between 1.5-times and 2.2-times, the distance between adjacent channels. The distance between adjacent cooling channels is measured between the centerlines of two adjacent cooling channels.

Should the optical surface of the substrate have a curvature in one or possibly two directions, the channel follows the curvature of the optical surface, that is to say the channel does not run in a straight line in the thickness direction of the substrate. Should the optical surface not have a curvature in the direction in which the channel runs or should the optical surface be a planar surface, then the channel may run in a straight line in the thickness direction. The channel may likewise have a curvature in a plane perpendicular to the thickness direction. By way of example, the channel may have a spiral form, meandering form, etc. For examples of (cooling) channels with different geometries, reference is made to DE 10 2009 039 400 A1, the entirety of which is incorporated in the content of this application by reference.

In a further embodiment, the substrate has a plurality of channels, with adjacent channels optionally having a (maximum) distance from one another that is not greater than a (typically constant) distance of the channels from the surface to which the reflective coating is applied. By way of example, the plurality of channels that run through the substrate may be aligned in parallel. For generating a temperature distribution in the substrate that is as homogeneous as possible, it was found to be advantageous if adjacent (cooling) channels are not spaced apart too much from one another. As described further above, the distance between adjacent cooling channels is measured between the centerlines of two adjacent cooling channels.

In a further embodiment, the substrate is formed from titanium-doped fused silica and the zero-crossing temperature of the titanium-doped fused silica varies by no more than 10 K peak-to-valley, such as by no more than 3 K peak-to-valley, in a volume region of the substrate between the surface and the at least one channel, and/or the coefficient of thermal expansion of the titanium-doped fused silica varies by less than 0.5 K/cm in the volume region. Titanium-doped fused silica has a so-called zero-crossing temperature, at which the temperature-dependent coefficient of thermal expansion has a zero crossing. The coefficient of thermal expansion of titanium-doped fused silica and hence also the zero-crossing temperature are adjusted by way of the titanium content of the fused silica. When producing the substrate, care has to be taken that the titanium content is as constant as possible, for example within the volume region between the surface and the respective channel, in order to generate a zero-crossing temperature that is as homogeneous as possible and in order to generate the smallest possible position-dependent gradient of the coefficient of thermal expansion in the substrate material. There are less stringent requirements on the thermal properties of the substrate material in a (further) volume region of the substrate which is further away from the optical surface than the channel or channels. By way of example, it may be sufficient for the zero-crossing temperature of the titanium-doped fused silica to vary by no more than 20 K peak-to-value in the further volume region and/or for the coefficient of thermal expansion of the titanium-doped fused silica to vary by less than 2 K/cm in the further volume region.

In a further embodiment, the channel has a roughness $R_a$ of less than 5 μm rms, such as less than 2 μm rms, on its inner side. As is generally conventional, the roughness $R_a$ is understood to mean the root-mean-square roughness. The roughness values specified above can be achieved when producing the channel or channels by way of selective laser-induced etching.

A further aspect of the disclosure relates to a lithography system, such as an EUV lithography system comprising: at least one optical element as described further above. The EUV lithography system can be an EUV lithography apparatus for exposing a wafer, or can be some other optical arrangement that uses EUV radiation, for example an EUV inspection system, for example for inspecting masks, wafers or the like that are used in EUV lithography. However, the optical element may also be used in another optical system, for example in a lithography system, such as in a lithography apparatus, for the DUV wavelength range.

In the latter case, the at least one channel may serve to integrate assemblies such as actuators, decouplings or the like into the substrate. It is therefore not mandatory for a coolant to be capable of flowing through the channel; rather, the channel may have only one end that is open to the surroundings, that is to say it may be in the form of a blind hole. By contrast, a channel through which a coolant is capable of flowing is understood to mean a channel which either itself has two ends that are open to the surroundings, that is to say which forms a through-channel, or through which—should a plurality of interconnected channels be provided in the substrate—a coolant is capable of flowing via two ends that are open to the surroundings.

In an embodiment, the lithography system has a cooling device for causing the coolant, such as a cooling liquid, to flow through the at least one channel of the substrate of the optical element. The cooling device may have corresponding ports and also lines for the supply and removal, respectively, of the cooling liquid, for example cooling water, into and from the respective channels. The cooling device may comprise a pump or the like for circulating the cooling liquid. An alternative option is for the cooling device to be in communication with a cooling water supply, via a cooling liquid port, for example via a cooling water port.

In a development, the cooling device is designed to cause the coolant to flow through the at least one channel of the substrate of the optical element with an overall volumetric flow rate of at least 1 l/min. The overall volumetric flow rate of the cooling fluid is understood to mean the summation of the volumetric flow rates of the cooling fluid flowing in parallel through all channels or channel sections of a respective branching level. To dissipate a heat output of the order of 10 W or more during the operation of the optical element, it can be desirable to use high volumetric flow rates of the order as specified above.

In a further development, the cooling device is designed to cause the coolant to flow through the at least one channel of the substrate of the optical element with a Reynolds number of less than 1000. To avoid FIV, it can be advantageous for the flow of the coolant to remain clearly in the laminar range, that is to say if the Reynolds number is significantly below 1000. Since the Reynolds number reduces with decreasing diameter of the channel, the provision of channels with small cross sections was found to be advantageous in view of FIV. The above-specified condition in relation to the Reynolds number is desirably satisfied at least in the partial volume of the substrate below the surface to which the reflective coating is applied. It can be advantageous but not mandatory for the condition specified above to be satisfied over the entire length of the cooling channel within the substrate volume.

As generally conventional, the Reynolds number is defined as:

$$Re = v_M d/v,$$

where $v_M$ denotes the mean flow speed of the coolant through the (constant) mean cross-sectional area of the channel, d denotes the (mean) diameter of the channel assumed to be circular, and v denotes the viscosity of the cooling fluid. As generally conventional, the mean flow speed denotes the mean value of the flow speeds at each point of the cross-sectional area of the channel. In the case of a channel with a non-circular cross section, the hydraulic diameter is used to calculate the Reynolds number.

Further features and aspects of the disclosure are evident from the following description of exemplary embodiments of the disclosure, with reference to the figures of the drawing showing certain details of the disclosure, and from the claims. The individual features can each be realized individually by themselves or as a plurality in any desired combination in a variant of the disclosure.

BRIEF DESCRIPTION OF THE DRAWINGS

Exemplary embodiments are depicted in the schematic drawings and are explained in the following description. In the drawings.

EXEMPLARY EMBODIMENTS

In the following description of the drawings, identical reference signs are used for identical or functionally identical components.

Figure 1A:
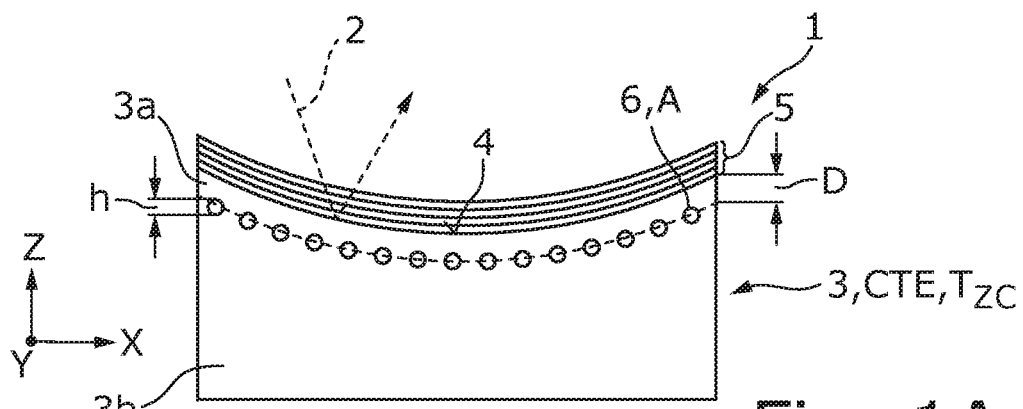
FIGS. 1A-1C show schematic representations of an optical element in the form of an EUV mirror.
Figure 1B:
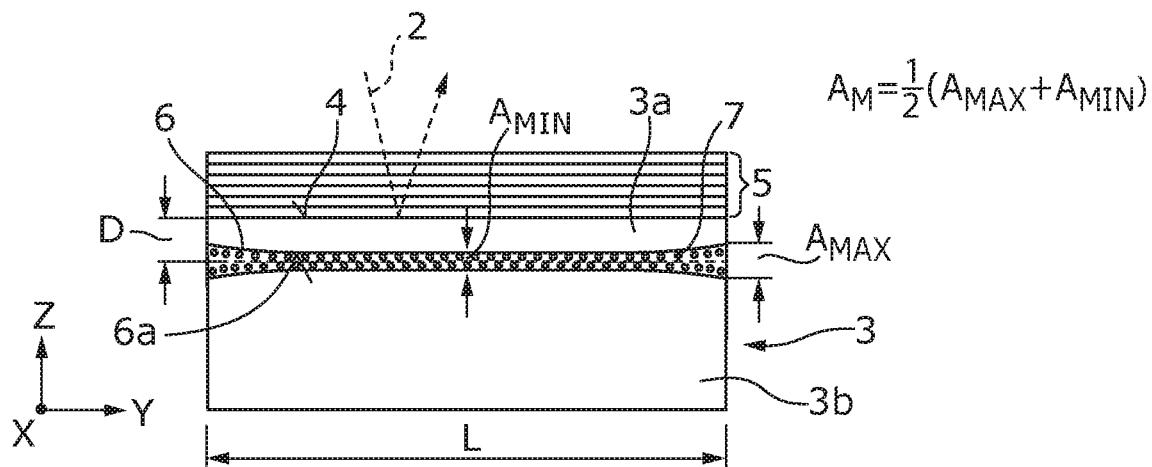
Figure 1C:
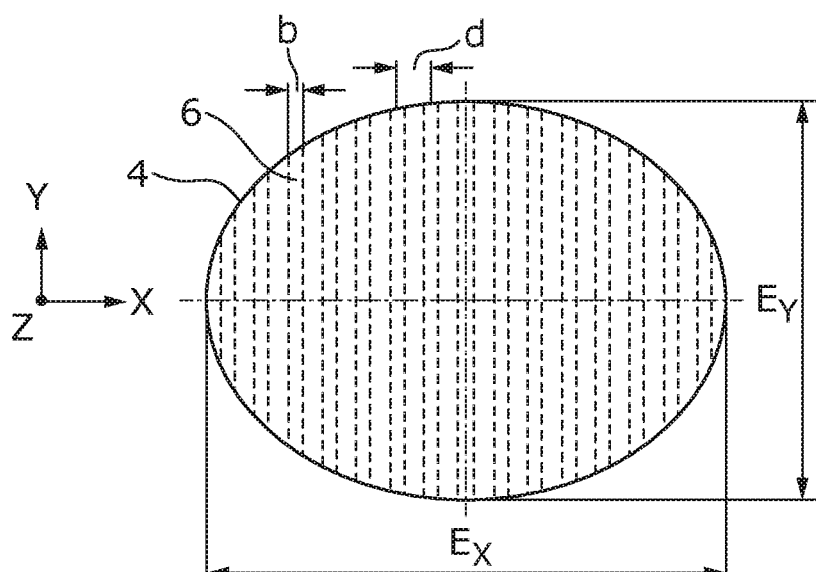

FIGS. 1A-1C schematically show the structure of an optical element 1 for reflecting EUV radiation 2. The optical element 1 comprises a substrate 3 with a surface 4 to which a reflective coating 5 is applied, the latter being designed to reflect the EUV radiation 2. The reflective coating 5 has alternating individual layers made of silicon and molybdenum for reflecting the EUV radiation 2 at a used wavelength of the order of approximately 13.5 nm. Depending on the used wavelength employed, other material combinations such as, e.g., molybdenum and beryllium, ruthenium and beryllium, or lanthanum and $B_4C$ are likewise possible as layer materials. The reflective multi-layer coating 5 typically has further functional layers which will not be discussed in more detail here.

In the example shown in FIGS. 1A-1C, the material of the substrate 3 is titanium-doped fused silica (ULE®), which has a small coefficient of thermal expansion CTE at the operating temperature of the optical element 1, the coefficient of thermal expansion having a zero crossing at a zero-crossing temperature $T_{ZC}$. Alternatively, the substrate 3 may be formed from a different material with a small coefficient of thermal expansion CTE, for example titanium-doped fused silica in the form of Asahi Zero, or in the form of a glass ceramic, for example Zerodur® or Clearceram®.

FIG. 1C shows a plan view of the optical element 1 or of the surface 4 of the substrate 3 to which the reflective coating 5 is applied; FIG. 1A shows a section through the substrate 3 along an XZ-plane that extends centrally through the surface 4; and FIG. 1B shows a section through the substrate 3 along a YZ-plane that likewise extends centrally through the substrate 3.

In the example shown in FIGS. 1A-1C, a plurality of, for example, fifteen channels 6 are formed in the substrate 3, each channel forming through-channels through the substrate 3, through which a coolant 7, for example in the form of cooling water, is capable of flowing or flows. Hence, the channels 6 are referred to as cooling channels 6 below. As is evident from FIG. 1C, the cooling channels 6 run parallel to one another through the substrate 3 along the Y-direction and each have a different length L. The cooling channel 6 with the greatest length L of 25 cm is depicted in FIG. 1B. As is evident from FIG. 1C, most of the other cooling channels 6 likewise have a somewhat significant length L of 20 cm or more.

The length of the cooling channel 6 depicted in FIG. 1B corresponds to the maximum extent $E_Y$ of the surface 4 of the substrate 3 in the Y-direction, which is smaller in the example shown than the maximum extent $E_X$ of the substrate 3 in the X-direction, which is approximately 35 cm in the example shown. Typical values for the maximum extent $E_X$, $E_Y$ of the surface 4 in the XY plane or in the projection into the XY-plane perpendicular to the thickness direction Z of the substrate 3 range between approximately 10 cm and approximately 100 cm.

As is evident on the basis of FIG. 1A, the surface 4 to which the reflective coating 5 is applied has a curvature in the XZ-plane or X-direction. By contrast, the surface 4 of the substrate 3 is not curved along the Y-direction (cf., FIG. 1B). In the example shown in FIGS. 1A-1C, the cooling channels 6 run at a substantially constant distance D from the curved surface 4 in the Z-direction, the distance D being approximately 1 cm in the example shown. In this case, the distance D is measured in the Z-direction between the center of the cross-sectional area of the respective cooling channel 6 and the surface 4 in the Z-direction. A substantially constant distance D of the cooling channel 6 from the surface is understood to mean that the distance D deviates by no more than +/−20%, such as by no more than +/−10%, for example by no more than +/−5%, from a mean distance over the length of the cooling channel 6, the mean distance forming the mean value of the maximum and the minimum distance of the cooling channel 6 from the surface 4 over the entire length L of the cooling channel 6.

In the example shown in FIG. 1A-1C, it is not only the distance D that is constant over the length L of an individual cooling channel 6 but the individual cooling channels 6 are also respectively arranged at the same distance D from the surface 4 in the Z-direction. This leads to different cooling channels 6 being arranged at different levels in the Z-direction within the substrate 3, as is evident from FIG. 1A. For cooling, it was found to be advantageous if the (constant) distance D is between 1-times and 3-times, such as between 1.5-times and 2.2-times, a distance d between adjacent channels 6. In this case, the distance d is measured between the centerlines of adjacent cooling channels 6, as is evident from FIG. 1C.

It was likewise found advantageous for cooling if the distance d between adjacent cooling channels 6 is not greater than a distance D between the cooling channels 6 and the surface 4 to which the reflective coating 5 is applied.

The cooling channels 6 are formed in the monolithic substrate 3 by selective laser-induced etching. During selective laser-induced etching, an ultrashort pulse laser beam is focused through the surface 4 into a focal volume within the substrate 3 that is transparent to the laser beam. In this case, the pulse energy is only absorbed within the focal volume as a result of multi-photon processes. In the focal volume, the optical and chemical properties of the transparent material of the substrate 3 are changed in such a way that it is rendered selectively chemically etchable. By deflecting the focus in the material of the substrate 3, for example using a scanner, contiguous regions are modified and these can be removed by way of wet chemical etching, as a result of which the cooling channels 6 shown in FIGS. 1A-1C are formed.

To increase the selectivity during wet chemical etching, the substrate 3 is irradiated in the region of the etching front during the etching process in the present case, to be precise with the laser radiation used for modifying the material of the substrate 3 at wavelengths of, e.g., approximately 1 μm—not necessarily in the form of ultrashort pulses—or with radiation at other wavelengths, for example via UV radiation. For example, selective laser-induced etching can be implemented directly in the etch bath. In this case, the ultrashort pulse laser radiation is typically focused at a focal volume which simultaneously forms the etching front of the etching process. In this way, the modified material is already released from the substrate 3 during the selective laser-induced etching, which increases the etch selectivity in the case of titanium-doped fused silica.

The cooling channel 6 depicted in exemplary fashion in FIG. 1B has a cross-sectional area A (cf., FIG. 1A) which varies by approximately +/−1.5% over the length L of the cooling channel 6. A variation of the cross-sectional area of the cooling channel 6 of +/−x % is understood to mean a deviation by +/−x % from a mean cross-sectional area $A_M$ of the cooling channel 6. The mean cross-sectional area $A_M$ is defined as the mean value of the maximum cross-sectional area $A_{MAX}$ and the minimum cross-sectional area $A_{MIN}$ along the length of the channel ($A_M=(A_{MAX}+A_{MIN})/2$). To make the representation in FIG. 1B clearer, the deviation between the maximum cross-sectional area $A_{MAX}$ and the minimal cross-sectional area $A_{MIN}$ has been depicted in exaggerated fashion. The variation in the cross-sectional area A of the cooling channel 6 may also be greater than in the case of the example described in FIG. 1B and, for example, may vary by no more than +/−20% or by no more than +/−10% over the entire length L of the cooling channel 6.

It can be advantageous if all cooling channels 6 fulfil the aforementioned criterion in respect of the constancy of the cross-sectional area A, even cooling channels 6 which have a length L that is shorter than 20 cm or 10 cm. Unlike what is depicted in FIGS. 1A-1C, the substrate 3 may also contain a network of a plurality of cooling channels 6, which are interconnected at junctions. To generate a constant flow rate, the (nominal) mean channel cross section $A_M$ changes at a respective junction for each division into two or more cooling channels 6 or at each merger of two or more cooling channels 6 (of a respective branching level). In this case, the above-described criterion relates to a cooling channel 6 of a respective branching level between two junctions or between a junction and an opening at the edge of the substrate. It is advantageous if the cooling channels of a respective branching level, which are connected in parallel in relation to the through-flow, have the same mean cross section $A_M$.

For effectively cooling the optical element 1, it was found to be advantageous if the cooling channel 6 has a mean cross-sectional area $A_M$ which is between 100 μm$^2$ and 25 mm$^2$, such as between 1 mm$^2$ and 25 mm$^2$. The cross-sectional area A of the cooling channels 6 was depicted in circular fashion in FIG. 1A, although it may also have a different geometry. Ideally, the cross-sectional area A of a respective cooling channel 6 has a height h in the thickness direction of the substrate 3 (Z-direction) which is only insubstantially larger than the width b of the cross-sectional area A of the cooling channel 6, which extends in the X-direction in the example shown. For the ratio of height h to width b of a respective cooling channel 6, the following applies at each position along the length L of the cooling channel 6 (in the Y-direction): h/b<5:1. By way of example, the following applies to the ratio of height h to width b of the cooling channel 6: h/b>1.0 or >0.9.

On account of the cooling channel 6 being produced by selective laser-induced etching, the cooling channel 6 has a roughness $R_a$ of less than 5 μm rms, such as less than 2 μm rms, on its inner side 6a, that is to say a significantly lower roughness than the case where the cooling channel 6 is produced by mechanical processing, for example by milling.

The example shown in FIG. 1A depicts a dashed, curved line, along which the centers of the cross-sectional areas A of all cooling channels 6 are situated. The centers or the centerlines of all cooling channels 6 extend through this (imaginary) line or through a curved surface formed by the (imaginary) boundary between a volume region 3a of the substrate 3, formed between the surface 4 and the cooling channels 6, and a further volume region 3b, which is situated further away from the surface 4 of the substrate 3.

The zero-crossing temperature $T_{ZC}$ of the substrate 3 made of titanium-doped fused silica varies by no more than 10 K peak-to-valley, such as by no more than 3 K peak-to-valley, in the surface-near volume region 3a. Moreover, the coefficient of thermal expansion CTE of the titanium-doped fused silica varies by less than 0.5 K/cm in the surface-near volume region 3a. The demands on the homogeneity of the titanium-doped fused silica material are typically less stringent in the volume region 3b more remote from the surface 4. There, it is sufficient if the zero-crossing temperature $T_{ZC}$ of the substrate 3 varies by no more than 20 K peak-to-valley. There can also be a more significant spatial variation in the coefficient of thermal expansion CTE of the titanium-doped fused silica than in the surface-near volume region 3a and, for example, be less than 2.0 K/cm.

The optical element 1 depicted in FIGS. 1A-1C can be used in different optical systems, for example in an EUV lithography apparatus 100, the schematic structure of which is described below on the basis of FIG. 2.

Figure 2:
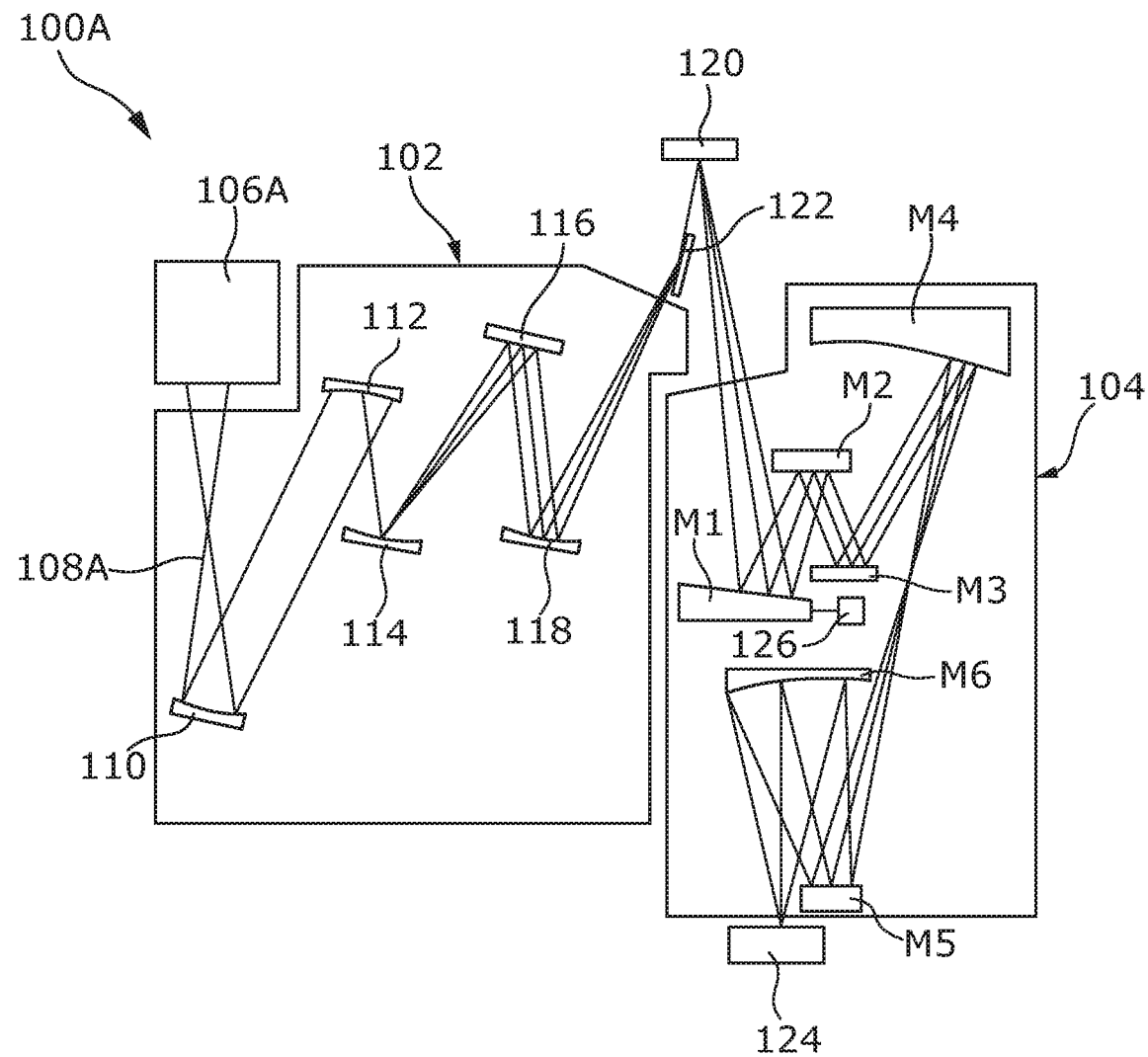
FIG. 2 shows a schematic representation of an EUV lithography apparatus.

The EUV lithography apparatus 100 depicted in FIG. 2 comprises a beam-shaping and illumination system 102 and a projection system 104. The beam-shaping and illumination system 102 and the projection system 104 are each provided in a vacuum housing, indicated in FIG. 2, with each vacuum housing being evacuated with the aid of an evacuation device (not shown). The vacuum housings are surrounded by a machine room (not depicted), in which the drive apparatuses for mechanically moving or setting the optical elements are provided. Furthermore, electrical controllers and the like may also be provided in the machine room.

The EUV lithography apparatus 100 comprises an EUV light source 106. A plasma source (or a synchrotron) which emits radiation 108 in the EUV range, for example in the wavelength range of between 5 nm and 20 nm, can be provided, for example, as the EUV light source 106. In the beam-shaping and illumination system 102, the EUV radiation 108 is focused and the desired operating wavelength is filtered out from the EUV radiation 108. The EUV radiation 108 generated by the EUV light source 106 has a relatively low transmissivity through air, for which reason the beam-guiding spaces in the beam-shaping and illumination system 102 and in the projection system 104 are evacuated.

The beam shaping and illumination system 102 illustrated in FIG. 2 has five mirrors 110, 112, 114, 116, 118. After passing through the beam-shaping and illumination system 102, the EUV radiation 108 is directed onto the photomask (reticle) 120. The photomask 120 is likewise in the form of a reflective optical element and may be arranged outside the systems 102, 104. Furthermore, the EUV radiation 108 may be directed onto the photomask 120 via a mirror 122. The photomask 120 has a structure which is imaged onto a wafer 124 or the like in a reduced fashion via the projection system 104.

The projection system 104 (also referred to as projection lens) has six mirrors M1-M6 for imaging the photomask 120 onto the wafer 124. It should be noted that the number of mirrors of the EUV lithography apparatus 100 is not restricted to the number illustrated. More or fewer mirrors could also be provided. Furthermore, the mirrors, in general, are curved on their front side for beam shaping, as described further above in conjunction with FIGS. 1A-1C. By way of example, the optical element 1 described in the context of FIGS. 1A-1C can be one of the six mirrors M1-M6 of the projection system 104.

By way of example, FIG. 2 shows a cooling device 126 for cooling the first mirror M1 of the projection system 104. The cooling device 126 is designed to supply the coolant 7, in the form of cooling water in the example shown, and has to this end supply and removal lines, not depicted, for supplying the coolant 7 to the channels 6 or for removing the coolant 7 from the channels 6. In the example shown, the cooling device 126 is designed to cause the coolant 7 to flow through the channels 6 of the substrate 3 of the optical element M1 with an overall volumetric flow rate of at least 1 l/min. The overall volumetric flow rate of the cooling fluid 7 is understood to mean the summation of the volumetric flow rates of the coolant 7 flowing in parallel through all channels 6. The cooling device 126 is also designed to cause the coolant 7 to flow through a respective channel 6 formed in the substrate 3 with a Reynolds number of less than 1000. To this end, the cooling device 126 generates a volumetric flow rate or a mean flow speed of the coolant 7 in the respective channel 6 which ensures a laminar flow of the coolant 7 in the channel 6 for the given geometric conditions, that is to say a given (hydraulic) diameter of the channel 6, and for a given viscosity of the coolant 7.

In place of a reflective coating for EUV radiation 2, a reflective coating for radiation in a different wavelength range, for example for the DUV wavelength range, may also be applied to the optical element 1 described above. In general, there are less stringent requirements in relation to the thermal expansion of the substrate 3 for such a reflective optical element 1, and so other substrate materials can be used to those described above, for example conventional fused silica. In this case, for example, the channel or channels 6 formed in the substrate 3 are not necessarily required for the flow of a coolant and are optionally not suitable for the flow of a coolant. In this case, the channels 6 may serve, for example, for the integration of component parts such as actuators or the like into the substrate 3, or for the creation of decouplings.

What is claimed is:

1. An optical element, comprising:
a substrate comprising a surface; and
an EUV reflective coating supported by the surface, wherein:
the substrate is monolithic;
the substrate comprises a member selected from the group consisting of fused silica and a glass ceramic;

the substrate comprises a channel configured to have a coolant flow therethrough;

below the surface supporting the EUV reflective coating, the channel has a length that is at least 10 centimeters;

below the surface supporting the EUV reflective coating, the channel has a cross-sectional area that varies by no more than +/−20% over the length of the channel.

2. The optical element of claim 1, wherein, below the surface supporting the EUV reflective coating, the length of the channel is at least 20 centimeters.

3. The optical element of claim 2, wherein, below the surface supporting the EUV reflective coating, the cross-sectional area of the channel varies by no more than +/−10% over the length of the channel.

4. The optical element of claim 1, wherein, below the surface supporting the EUV reflective coating, the cross-sectional area of the channel varies by no more than +/−10% over the length of the channel.

5. The optical element of claim 1, wherein the substrate comprises a titanium-doped fused silica.

6. The optical element of claim 1, wherein the channel has a mean cross-sectional area of between 100 square micrometers and 25 square millimeters.

7. The optical element of claim 1, wherein the channel has a mean cross-sectional area of between one square millimeter and 25 square millimeters.

8. The optical element of claim 1, wherein the cross-sectional area of the channel has a ratio of height to width of less than 5:1.

9. The optical element of claim 1, wherein the surface supporting the EUV reflective coating has a maximum extent of between 10 centimeters and 100 centimeters in at least one direction perpendicular to a thickness direction of the substrate.

10. The optical element of claim 1, wherein:

the optical element comprises a plurality of channels configured to have the coolant flow therethrough; and for at least one of the channels:

the channel runs at a substantially constant distance from the surface supporting the EUV reflective coating to which the reflective coating; and the substantially constant distance is between one to three times a distance between adjacent channels.

11. The optical element of claim 10, wherein the surface supporting the EUV reflective coating is curved.

12. The optical element of claim 1, wherein the optical element comprises a plurality of channels, and a distance between adjacent channels is not greater than a distance of the channels from the surface supporting the EUV reflective surface.

13. The optical element of claim 1, wherein the substrate comprises titanium-doped fused silica having a zero-crossing temperature that varies by no more than 5 K peak-to-valley in a volume region of the substrate between the channel the surface supporting the EUV coating.

14. The optical element of claim 1, wherein the substrate comprises titanium-doped fused silica having a coefficient of thermal expansion that varies by less than 0.5 K/cm in a volume region of the substrate between the channel the surface supporting the EUV coating.

15. The optical element of claim 1, wherein the channel has a roughness $R_a$ of less than 5 μm rms on its inner side.

16. A lithography system, comprising:

an optical element according to claim 1, wherein the lithography system is an EUV lithography system.

17. The lithography system of claim 16, further comprising a cooling device configured to cause the coolant to flow through the channel.

18. The lithography system of claim 16, further comprising a cooling device configured to cause the coolant to flow through the channel with an overall volumetric flow rate of at least one liter per minute.

19. The lithography system of claim 16, further comprising a cooling device configured to cause the coolant to flow through the channel with a Reynolds number of less than 1000.

20. The optical element of claim 1, wherein the channel is curved in a direction perpendicular to a thickness direction of the substrate.

21. An optical element, comprising:

a substrate comprising a surface; and an EUV reflective coating supported by the surface, wherein:

the substrate comprises a member selected from the group consisting of fused silica and a glass ceramic;

the substrate comprises a channel configured to have a coolant flow therethrough;

the channel has a roughness $R_a$ of less than 5 μm rms on its inner side;

below the surface supporting the EUV reflective coating, the channel has a length that is at least 10 centimeters;

below the surface supporting the EUV reflective coating, the channel has a cross-sectional area that varies by no more than +/−20% over the length of the channel.

* * * * *

UNITED STATES PATENT AND TRADEMARK OFFICE
CERTIFICATE OF CORRECTION

PATENT NO. : 11,874,525 B2
APPLICATION NO. : 17/805175
DATED : January 16, 2024
INVENTOR(S) : Eric Eva Page 1 of 1

It is certified that error appears in the above-identified patent and that said Letters Patent is hereby corrected as shown below:

In the Specification

Column 1, Line 43, delete "temperature.A" insert --temperature.--.

Column 9, Line 46, delete "FIG." insert --FIGS.--.

Signed and Sealed this
Ninth Day of April, 2024

Katherine Kelly Vidal
*Director of the United States Patent and Trademark Office*